US010784846B1

(12) United States Patent
Bucossi et al.

(10) Patent No.: US 10,784,846 B1
(45) Date of Patent: Sep. 22, 2020

(54) DIFFERENTIAL CLOCK DUTY CYCLE CORRECTION WITH HYBRID CURRENT INJECTORS AND TAPERED DIGITAL TO ANALOG CONVERTER

(71) Applicant: GLOBALFOUNDRIES INC., Grand Cayman (KY)

(72) Inventors: William L. Bucossi, Waterbury, VT (US); Barry L. Stakely, Snow Camp, NC (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/791,071

(22) Filed: Feb. 14, 2020

(51) Int. Cl.
*H03K 5/156* (2006.01)
*H03M 1/74* (2006.01)
*H03K 7/08* (2006.01)

(52) U.S. Cl.
CPC ........... *H03K 5/1565* (2013.01); *H03K 7/08* (2013.01); *H03M 1/745* (2013.01)

(58) Field of Classification Search
CPC ........ H03K 3/017; H03K 5/1565; H03K 5/04; H03K 7/08
USPC .................. 327/175, 172–174, 170
See application file for complete search history.

(56) References Cited

U.S. PATENT DOCUMENTS

| 6,411,145 | B1 | 6/2002 | Kueng et al. | |
| 6,967,514 | B2 * | 11/2005 | Kizer | H03K 5/1565 |
| | | | | 327/175 |
| 6,982,581 | B2 | 1/2006 | Dosho et al. | |
| 8,004,331 | B2 * | 8/2011 | Li | H03K 5/1565 |
| | | | | 327/175 |
| 2009/0160516 | A1 * | 6/2009 | Guo | H03K 5/1565 |
| | | | | 327/175 |
| 2010/0315148 | A1 * | 12/2010 | Zhu | H03K 3/01 |
| | | | | 327/298 |
| 2013/0285726 | A1 * | 10/2013 | Roytman | H03K 5/1565 |
| | | | | 327/175 |

* cited by examiner

*Primary Examiner* — Tomi Skibinski
(74) *Attorney, Agent, or Firm* — David Cain; Hoffman Warnick LLC (57) ABSTRACT

Embodiments of the disclosure provide a differential clock duty cycle correction (DCC) circuit, including: a hybrid current injector including current sources for generating a correction current, wherein the correction current is added to a clock signal of a first polarity at a first correction node and subtracted from a clock signal of an opposite polarity at a second correction node, and wherein a plurality of the current sources in the hybrid current injector are controlled by a first portion of a n-bit DAC code to generate the correction current; and a current DAC for receiving a second, different portion of the n-bit DAC code and for outputting a corresponding reference current to the current sources in the hybrid current injector, wherein the current sources generate the correction current in response to the reference current output by the current DAC for the second portion of the n-bit DAC code.

20 Claims, 7 Drawing Sheets

FIG. 7

DIFFERENTIAL CLOCK DUTY CYCLE CORRECTION WITH HYBRID CURRENT INJECTORS AND TAPERED DIGITAL TO ANALOG CONVERTER

BACKGROUND

The present disclosure relates to clock signals, and more specifically, to a differential clock duty cycle correction circuit with hybrid current injectors and tapered current digital to analog converter (DAC).

Clock signals are commonly used in all electronic devices and integrated circuits with the ability to store information (memory). Clock signals may be generated with various types of oscillators and supporting circuitry. A clock signal continually transitions between two levels (e.g., logic high and logic low levels). The clock signal has a duty cycle that is determined by the time duration at logic high and the time duration at logic low.

The duty cycle of a clock signal is generally stated as a percentage. For example, a clock signal that has a pattern of 80% high and 20% low has an 80% duty cycle. In some applications, a clock signal with a 50% duty cycle may be required. For example, circuits that rely on both clock edges may not function properly if a clock signal deviates significantly from a 50% duty cycle. For such circuits, it is common to employ a duty cycle correction (DCC) control loop to compensate for duty cycle distortion (DCD) caused by variations in the manufacturing process, operating temperature, power supply voltage and noise.

SUMMARY

A first aspect of the disclosure is directed to a differential clock duty cycle correction (DCC) circuit, including: a hybrid current injector including current sources for generating a correction current, wherein the correction current is added to a clock signal of a first polarity at a first correction node and subtracted from a clock signal of an opposite polarity at a second correction node, and wherein a plurality of the current sources in the hybrid current injector are controlled by a first portion of a n-bit DAC code to generate the correction current; and a current DAC for receiving a second, different portion of the n-bit DAC code and for outputting a corresponding reference current to the current sources in the hybrid current injector, wherein the current sources generate the correction current in response to the reference current output by the current DAC for the second portion of the n-bit DAC code.

A second aspect of the disclosure includes a method for differential clock duty cycle correction (DCC), including: generating an n-bit digital to analog converter (DAC) code corresponding to a duty cycle correction, the DAC code having a first portion and a second portion; receiving the second portion of the DAC code at a current DAC, the current DAC generating a reference current in response to the second portion of the DAC code; for DAC codes in the first portion of the n-bit DAC code, controlling current sources in a hybrid current injector to generate a correction current; and for DAC codes in the second portion of the n-bit DAC code, generating the correction current in the hybrid current injector based on the reference current.

A third aspect of the disclosure provides a differential clock duty cycle correction (DCC) circuit, including: an n-bit digital-to-analog converter (DAC) code corresponding to a DCC correction, the n-bit DAC code including a first portion including a first m bits of the n-bit DAC code and a second portion including bits m+1 to n of the n-bit DAC code; a hybrid current injector for generating a correction current, wherein the correction current is added to a clock signal of a first polarity at a first correction node and subtracted from a clock signal of an opposite polarity at a second correction node, and wherein the hybrid current injector is controlled by DAC codes in the first portion of the n-bit DAC code; and a tapered current DAC for receiving the second portion of the n-bit DAC code, and for outputting a corresponding reference current to the hybrid current injector, wherein the hybrid current injector generates the correction current in response to the reference current; wherein the tapered current DAC generates a constant reference current for DAC codes in the first portion of the n-bit DAC code. and wherein the DCC circuit has a substantially linear DCC step transfer function.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Figure 1:
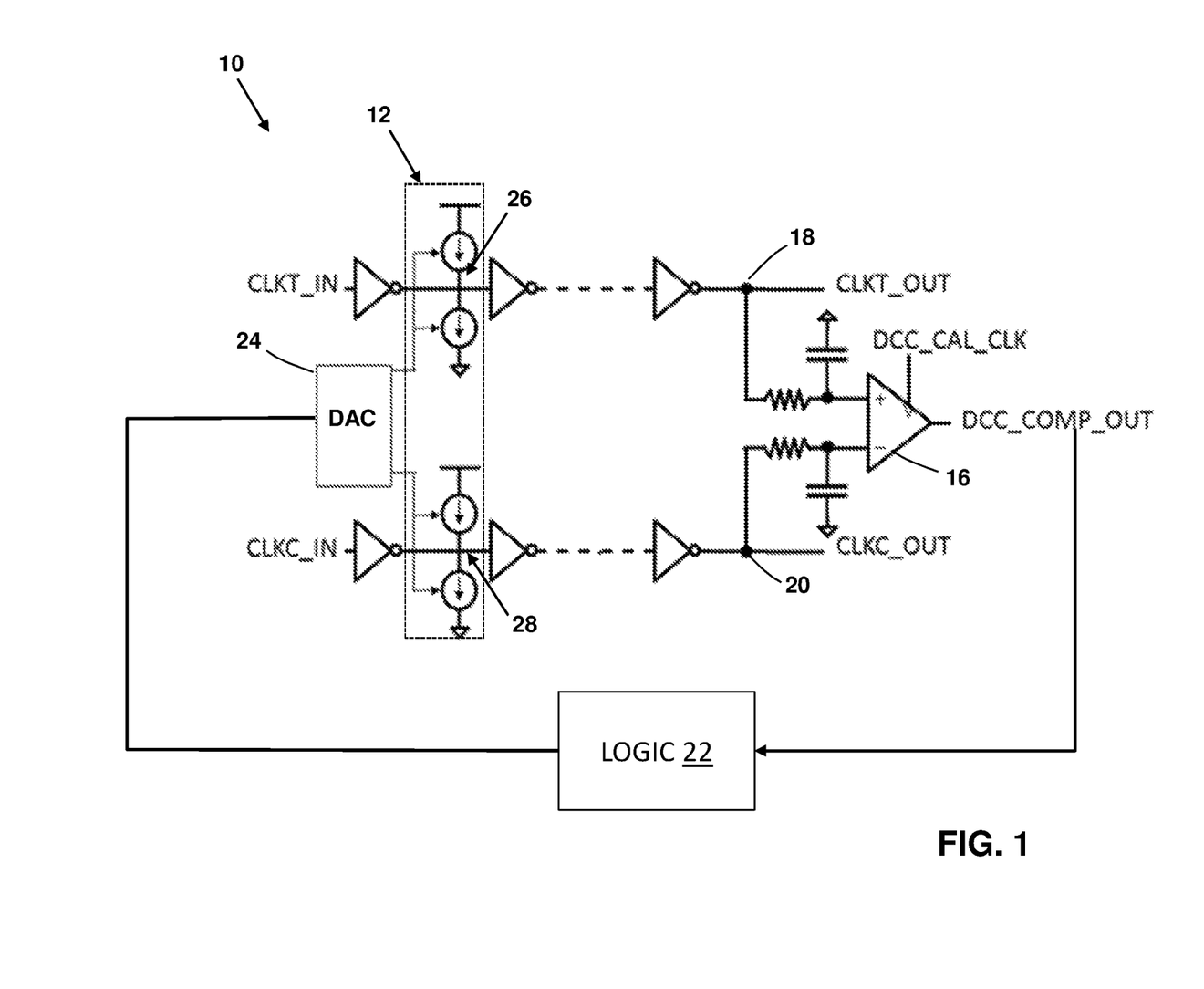
FIG. 1 depicts a conventional duty cycle correction (DCC) circuit with analog controlled dynamic current sources.

Conventional duty cycle correction (DCC) circuits, such as the DCC circuit depicted in FIG. 1, typically have range and resolution specifications which can be competing requirements, especially if the DCC circuit does not have a linear DCC step transfer function (e.g., DCC step size varies as a function of the DAC current). Typically, the range is reduced until the largest duty cycle step meets a minimum resolution specification. Conventional DCC circuits designed specifically to have a linear transfer function, however, often require more area and more complex wiring to implement. This often results in additional parasitic capacitance, which can limit the bandwidth or increase the power consumption of the clock circuit. In some implementations, semiconductor devices in DCC circuits may operate in undesirable regions (e.g., the sub-threshold region) over portions of the dynamic range. In the sub-threshold region of operation, device to devices mismatch is amplified and transistor device models are typically less accurate. This may result in a severely non-linear DCC step size or in the worst case, unpredicted uncorrectable DCD.

As depicted in FIG. 1, one common type of differential DCC circuit 10 employs an analog controlled current injector 12. The current injector 12 is also commonly referred to as a charge injector because a fixed quantity of charge is injected over a given clock period. The current injector is configured to add a fixed quantity of correction current to a clock signal (e.g., CLKT_IN) of a first polarity and subtract the same quantity of correction current from the clock signal (e.g., CLKC_IN) with the opposite polarity. In the DCC circuit 10, a comparator 16 outputs a signal DCC_COMP_OUT, corresponding to the difference between the duty cycles of the clock signals CLKT_IN, CLKC_IN at measurement nodes 18, 20. The signal DCC_COMP_OUT specifies the direction of required duty cycle correction. Digital Logic 22 increments/decrements the DAC code or adjusts the sign bit to an n-bit (e.g., 64-bit) current DAC 24. The DAC 24 outputs a reference current $I_{ref}$ corresponding to the received DAC code to the current injector 12. In response, the current injector 12 adds a correction current to/from the clock signal CLKT_IN at a correction node 26 according to the received sign bit, and adds the same quantity but opposite sign of correction current from/to the clock signal CLKC_IN at a correction node 28. The current sourced by the current injector 12 changes as a function of the compensated node voltage. When the feedback loop converges and the duty cycle distortion (DCD) is driven to a quantity less than one bit of correction resolution, the current injector 12 has adjusted the rise/fall time at the correction nodes 26, 28 to offset the open loop DCD at the measurement nodes 18, 20.

The current injector 12 typically includes a plurality of semiconductor devices (e.g., transistors). As the DAC code of the n-bit DAC 24 increases from 0 to n (e.g., n=64), the reference current $I_{ref}$ provided by the DAC 24 incrementally increases the gate bias voltage of the devices within the current injector 12. The devices transition from sub-threshold to saturation and approach triode operation. As the gate overdrive on devices of the current injector 12 incrementally increases, the devices of the current injector 12 source incrementally more current but the output voltage range over which they operate in the saturated region decreases. For example, for lower DAC codes provided to the DAC 24, the devices in the current injector 12 may operate in the sub-threshold region, while for higher DAC codes, the devices in the current injector 12 may operate in the saturated region. When $V_{gs}<V_t$ there is weak inversion or subthreshold current. In this mode of operation, $I_{ds}$ increases exponentially as a function of $V_{gs}$. Once $V_{gs}>V_t$, $I_{ds}$ increases as the square of $V_{gs}$. The DAC code where the current sources transition out of subthreshold is dependent on how the devices are sized.

Figure 6:
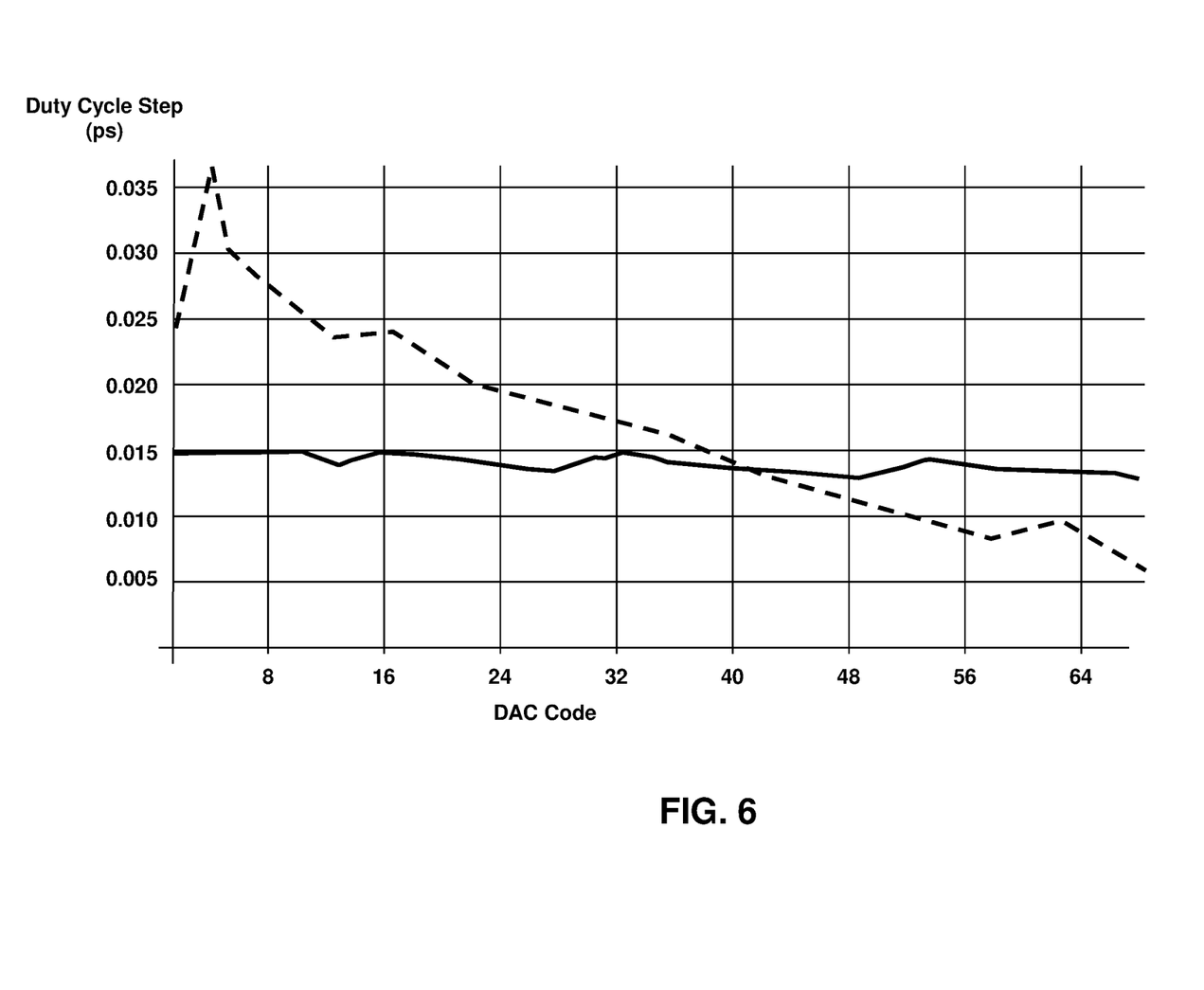
FIG. 6 depicts a chart of duty cycle step versus DAC code for the for conventional DCC circuit of FIG. 1 and the DCC circuit depicted in FIG. 5 according to embodiments.

As the devices in the current injector 12 transition through these regions of operation, the incremental addition of current decreases in a non-linear fashion (e.g., the current step size decreases as the DAC code of the DAC 24 increases). This may result in severe non-linearity in DCC step size, especially over the portion of the range where the current sources are operating in the subthreshold region. In addition, this may result in a time delay step size at the correction nodes 26, 28, which may be up to 5× larger for the lowest DAC codes compared to the highest DAC codes. Further, this may affect the range of the DCC circuit 10, which is limited by the maximum step size occurring at the 0→1/1→0 DAC code transitions. An example of the degree of non-linearity suffered by a differential DCC circuit such as the differential DCC circuit 10 is indicated by the dashed line in the chart of duty cycle step vs. DAC code depicted in FIG. 6.

Figure 2:
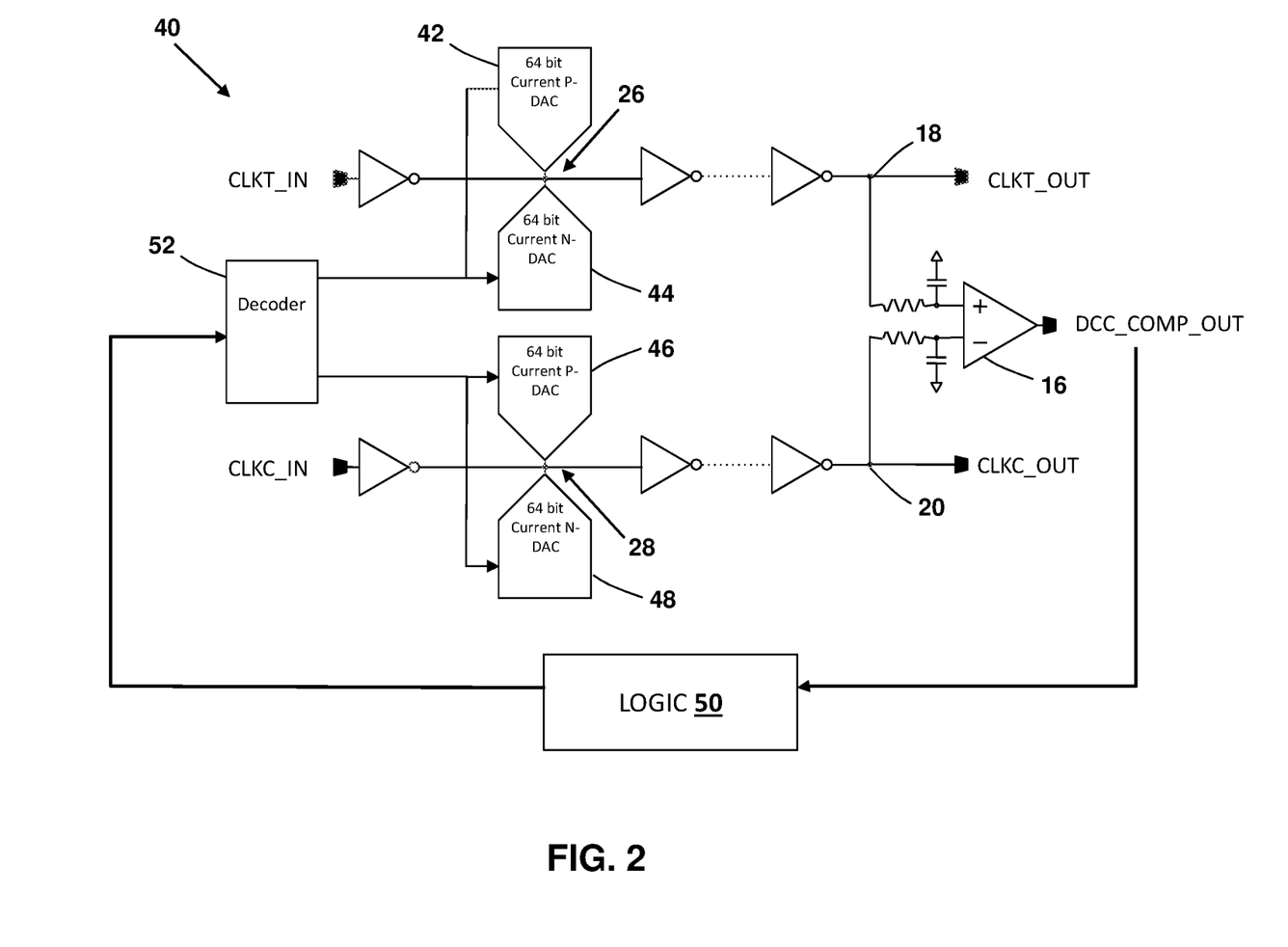
FIG. 2 depicts a conventional DCC circuit with digitally controlled dynamic current sources.

FIG. 2 depicts a conventional DCC circuit 40 with digitally controlled dynamic current sources. Unlike the DCC circuit 10 shown in FIG. 1, which includes an analog controlled current injector 12, the DCC circuit 40 includes positive and negative current DACs directly connected to the correction nodes 26, 28. For example, as illustrated in FIG. 2, a positive current DAC 42 and negative current DAC 44 are coupled to the correction node 26, while a positive current DAC 44 and negative current DAC 48 are coupled to the correction node 28.

A comparator 16 outputs a signal DCC_COMP_OUT, corresponding to the difference between the duty cycles of the clock signals CLKT_IN, CLKC_IN at the measurement nodes 18, 20. The signal DCC_COMP_OUT is provided to digital logic 50, which increments or decrements the DAC code and sign bit of decoder 52 accordingly. The decoder 52 outputs DAC codes corresponding to the required correction current to the positive and negative current DACs 42, 44 coupled to the correction node 26 and the positive and negative current DACs 46, 48 coupled to the correction node 28. In response, the positive and negative current DACs 42, 44, 46, 48 are configured to selectively add or subtract a fixed quantity of correction current to node 26 and an equal magnitude but opposite polarity to node 28. The incremental addition/subtraction of current at nodes 26 and 28 incrementally distorts the clock duty cycle effectively cancelling the open loop DCD measured at CLKT_OUT/CLKC_OUT.

Since all of the positive and negative current DACs in the DCC circuit 40 have the same operating point independent of DAC code, the DCC circuit 40 has much more linear DAC code versus duty cycle correction transfer function than the DCC circuit 10. However, achieving such linearity comes at the expense of area (e.g., >4×), wiring complexity (e.g., >4×), and parasitic capacitance (e.g., >5×) compared to the DCC circuit 10.

Figure 3:
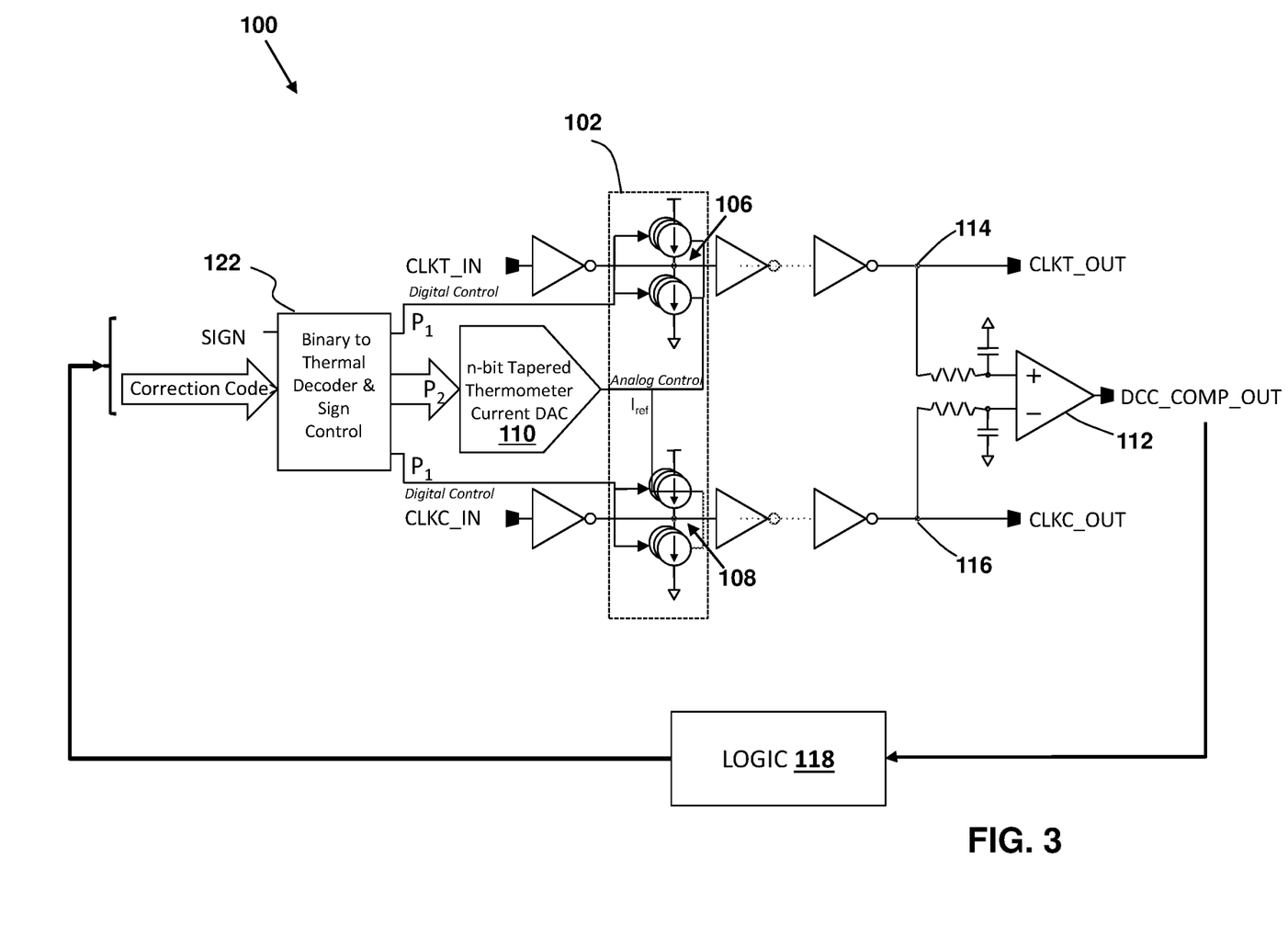
FIG. 3 depicts a differential clock DCC circuit with hybrid current injectors and tapered current digital to analog converter (DAC) according to embodiments.
Figure 4:
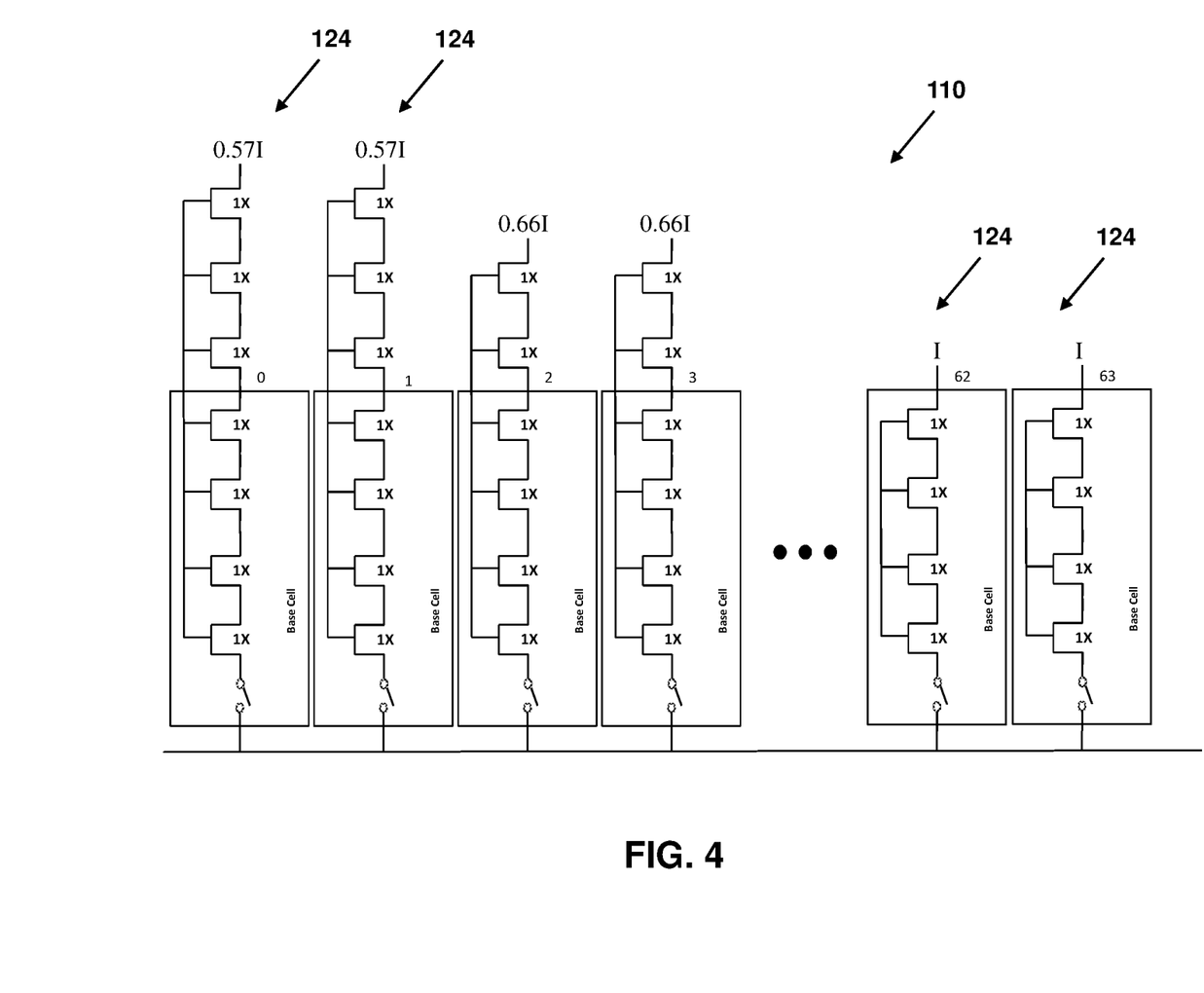
FIG. 4 depicts a tapered current DAC according to embodiments.

FIGS. 3 and 4 depicts a differential DCC circuit 100 with a hybrid current injector 102 connected to correction nodes 106, 108, and a tapered current DAC 110, according to embodiments. Unlike the conventional DCC circuits 10, 40 described above, the DCC circuit 100 provides both analog and digital control of the current sources forming the hybrid current injector 102. Advantageously, compared to conventional DCC circuits, the DCC circuit 100 provides a more linear DCC step transfer function, prevents sub-threshold operation of all current source devices, and can be implemented in less area, with fewer wires and lower parasitic capacitance.

In the DCC circuit 100, the hybrid current injector 102 is configured to add/subtract a fixed quantity of correction current to a clock signal CLKT_IN, CLKC_IN of a first polarity and add/subtract the same quantity but opposite sign of correction current from the clock signal CLKT_IN, CLKC_IN, with the opposite polarity. In the DCC circuit 100, a comparator 112 outputs a signal DCC_COMP_OUT, corresponding to the difference between the duty cycles of the differential clock signals CLKT_IN, CLKC_IN at measurement nodes 114, 116. The signal DCC_COMP_OUT is provided to digital logic 118, which increments or decrements the DAC code and adjusts the sign bit of decoder 52 accordingly. The digital logic 118 outputs a DAC code, which is typically an incremental change (e.g., ±1) to the prior DAC code or a change to the sign bit, to a decoder 122 (e.g., a 6-bit binary to thermal decoder). In response, the decoder 122 outputs an n-bit thermal DAC code (e.g., 64-bit).

According to embodiments, the DAC code output by the decoder 122 is divided into several portions. For example, an n-bit DAC code output by the decoder 122 may include a first portion $P_1$ including the first m least significant bits of the DAC code and a second portion $P_2$ including the remaining bits (e.g., m+1 to n bits) of the DAC code. For a 64-bit DAC code (e.g., n=64), for example, the first portion $P_1$ of the DAC code may include the first 16 least significant bits (e.g., bits 0:15) and the second portion $P_2$ of the DAC code may include the remaining 48 bits (e.g., bits 16:63). As depicted in FIGS. 3 and 4, the first portion $P_1$ of a 64-bit DAC code (e.g., bits 0:15) is provided as a digital control input to the hybrid current injector 102. The second portion $P_2$ of the 64-bit DAC code (e.g., bits 16:63) is input to the tapered current DAC 110, which is configured to output a reference current $I_{ref}$ as an analog control input to the hybrid current injector 102. The reference current derived from tapered current DAC 110 remains constant over the first portion P1 of the n-bit DAC code.

According to embodiments, the tapered current DAC 110 may be implemented as an n-bit (e.g., 64-bit) thermally weighted current DAC. A non-limiting example of such a tapered current DAC 110 is depicted in FIG. 4. As shown, each slice (leg) 124 of the tapered current DAC 110 is weighted as necessary to compensate for any residual non-linearity of the analog current sources in the hybrid current injector 102. For example, as shown in FIG. 4, in the case of larger DCC step sizes at lower DAC codes and smaller DCC step sizes at higher DAC codes, the slices 124 of the tapered current DAC 110 corresponding to lower DAC codes may be assigned a lower weight (e.g., a weight<1) compared to the slices 124 of the tapered current DAC 110 at higher DAC codes. This effectively linearizes the DCC step size across the dynamic range (e.g., a reduction of up to 5×). To this extent, maximum linearity in the DCC step transfer function may be achieved by tuning the effective "weight" of each DAC slice 124.

Figure 5:
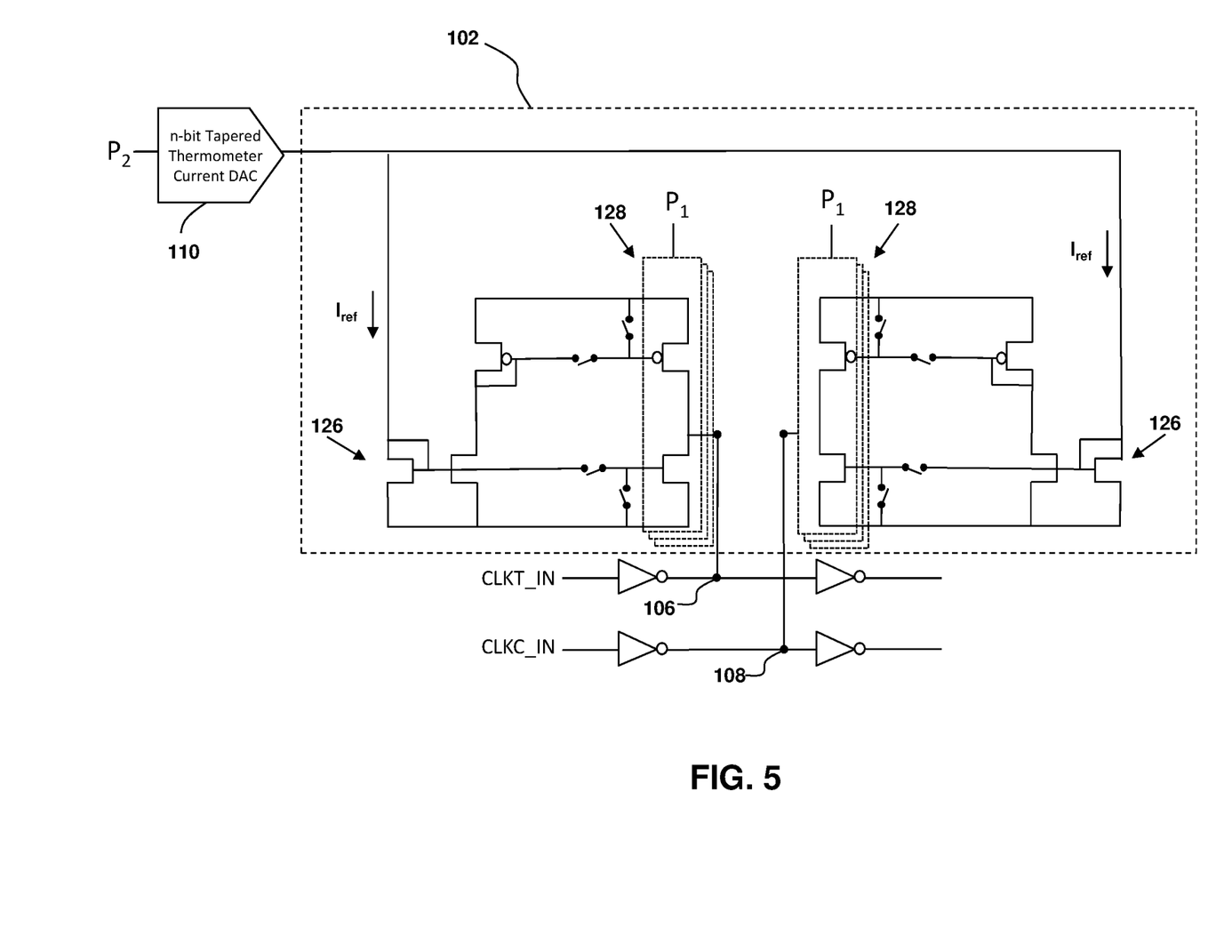
FIG. 5 depicts a hybrid current injector with tapered current DAC according to embodiments.

As depicted in FIGS. 3 and 5, the second portion $P_2$ of the 64-bit DAC code (e.g., bits 16:63) is input into the tapered current DAC 110, which is configured to output a reference current $I_{ref}$ as an analog control input to the hybrid current injector 102. For example, as the DAC code is decremented from 63 to 16, the tapered current DAC 110 decrements the reference current $I_{ref}$ input to the hybrid current injector 102 by a fixed amount. In response, and based on the received sign bit, the hybrid current injector 102 is configured to add/subtract a fixed quantity of correction current (e.g., $I_{ref}$) to a clock signal CLKT_IN, CLKC_IN of a first polarity and add/subtract the same quantity but opposite polarity of correction current from the clock signal CLKT_IN, CLKC_IN with the opposite polarity. Because of the use of the tapered current DAC 110, the DCC step size remains substantially linear as the as the DAC code is decremented (e.g., from 63 to 16).

The reference current $I_{ref}$ is provided to, and sets the gate bias voltage of, catch diodes 126 in the hybrid current injector 102. The gate bias voltage is applied to the transistors of the current sources in the hybrid current injector 102 to source the required amount of correction current. As the DAC code is decremented (e.g., from 63 to 16), and the magnitude of the reference current $I_{ref}$ is decremented accordingly by the tapered current DAC 110, the transistors in the hybrid current injector 102 operate in the saturated region. At DAC codes below m+1, the reference current derived in the tapered current DAC 110, and therefore the current density in the current sources of the hybrid current injector 102, remains constant. The current sources in the hybrid current injector 102 are sized to avoid sub-threshold operation for all DAC codes with the code of m+1 (e.g., 16) being the limiting condition.

While use of the tapered current DAC 110 compensates for the inherent nonlinearity of the adjustable analog current sources, the hybrid injector 102 is further configured to address the DCC step size variation caused by devices operating in the sub-threshold region that may occur at low DAC codes. For example, according to embodiments, as depicted in FIG. 5, the current sources in each of the hybrid current injector 102 may be partitioned into sets of m current sources (slices) 128 connected in parallel, where each current source 128 is directly enabled/disabled by one of the m DAC codes in the first portion $P_1$ of the DAC codes (bits 0:15). For instance, for a DAC code of m, all m of the current sources 128 are enabled, for a DAC code of m−1, m−1 of the current sources 128 are enabled, and so on. To this extent, the magnitude of the correction current applied to the correction nodes 106, 108 may be increased/decreased as required by selectively enabling/disabling one or more of the m current sources 128 in accordance with the first portion $P_1$ of the DAC code output by the decoder 122. In other words, the first portion $P_1$ of the DAC code output by the decoder controls the effective "size" of the current sources in the hybrid current injector 102. Advantageously, the reference current $I_{ref}$ output by the tapered current DAC 110 and the current density of the current sources of the hybrid current injector 102 remains at a constant level sufficient to ensure that that transistors of the current sources in the hybrid current injector 102 do not operate in the sub-threshold, thereby improving the linearity of the DCC step transfer function at low DAC codes. An example of the linearity improvements provided by the differential DCC circuit 100 in accordance with embodiments of the disclosure is indicated by the solid line in the chart of duty cycle step vs. DAC code depicted in FIG. 6.

In summary, as detailed above, the first portion $P_1$ of the DAC code (e.g., bits 0:15) may be used to directly control the m current sources 128 in the hybrid current injector 102, preventing sub-threshold operation of the current source devices and optimizing the linearity of the DCC step transfer function at low DAC codes. The second portion $P_2$ of the DAC code (e.g., bits 16:63) may be used to control the magnitude of the reference current $I_{ref}$ output by the tapered current DAC 110, which optimizes the linearity of the DCC step transfer function at higher DAC codes.

Figure 7:
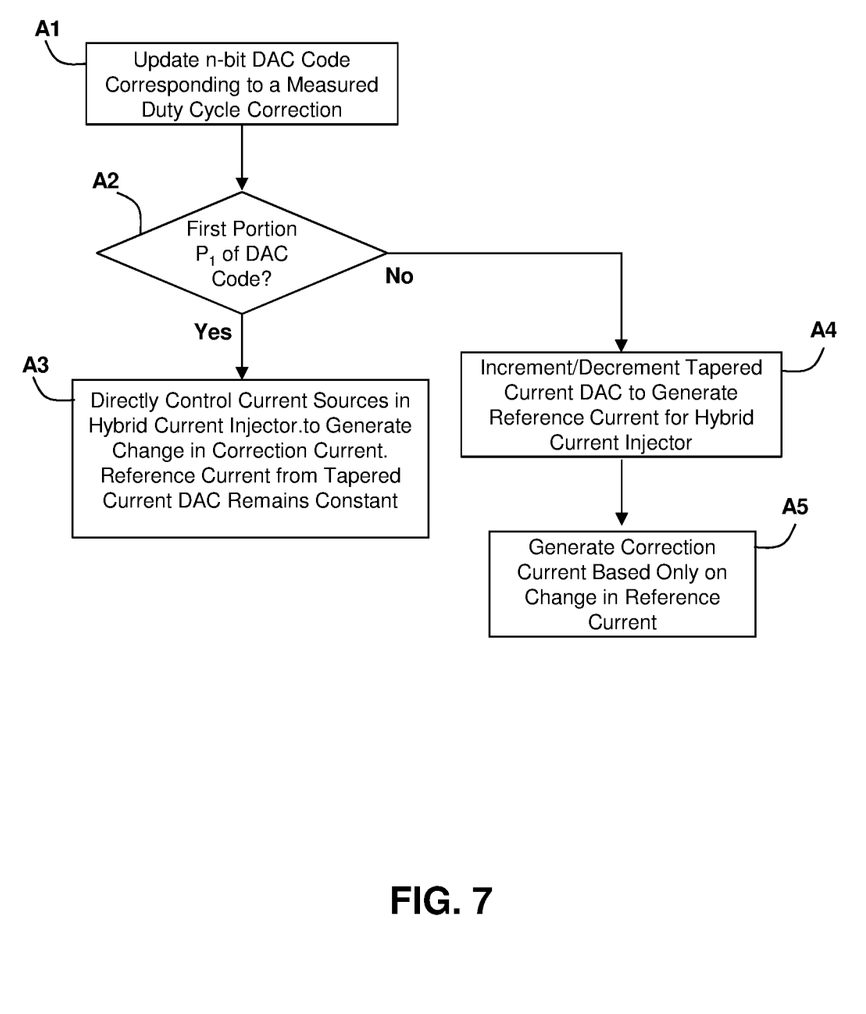
FIG. 7 depicts a flow diagram of a process for differential clock duty cycle correction according to embodiments.

FIG. 7 depicts a flow diagram of a process for differential clock duty cycle correction according to embodiments. At process A1, an n-bit digital to analog converter (DAC) code corresponding to a duty cycle correction is updated corresponding to a measured duty cycle correction. At process A2, for DAC codes in a first portion $P_1$ of the n-bit DAC code (Yes at process A2), the DAC code is used at process A3 to directly control current sources in a hybrid current injector 102 to generate a change to a correction current. As detailed above, the reference current provided by the tapered current DAC 110 remains constant. For DAC codes in a second portion $P_2$ of the n-bit DAC code (No at process A2), the tapered current DAC 110 is incremented/decremented accordingly to generate a reference current at process A4 and, at process A5, the hybrid current injector generates a correction current based only on the change in the reference current.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A differential clock duty cycle correction (DCC) circuit, comprising:
   a hybrid current injector including current sources for generating a correction current, wherein the correction current is added to a clock signal of a first polarity at a first correction node and subtracted from a clock signal of an opposite polarity at a second correction node, and wherein a plurality of the current sources in the hybrid current injector are controlled by a first portion of a n-bit DAC code to generate the correction current; and
   a current DAC for receiving a second, different portion of the n-bit DAC code and for outputting a corresponding reference current to the current sources in the hybrid current injector, wherein the current sources generate the correction current in response to the reference current output by the current DAC for the second portion of the n-bit DAC code.

2. The DCC circuit according to claim 1, wherein the current DAC generates a constant reference current over the first portion of the n-bit DAC code.

3. The DCC circuit according to claim 1, wherein the first portion of the n-bit DAC code includes m least significant bits of the n-bit DAC code.

4. The DCC circuit according to claim 3, wherein the second portion of the n-bit DAC code includes bits m+1 to n of the n-bit DAC code.

5. The DCC circuit according to claim 1, wherein the current sources comprise a plurality of semiconductors devices, and wherein none of the semiconductor devices operate in a sub-threshold region.

6. The DCC circuit according to claim 1, wherein the DCC circuit has a substantially linear DCC step transfer function.

7. The DCC circuit according to claim 6, wherein the current DAC comprises a tapered current DAC.

8. The DCC circuit according to claim 7, wherein the tapered current DAC comprises a plurality of slices, and wherein each of the plurality of slices is weighted to linearize the DCC step transfer function.

9. The DCC circuit according to claim 8, wherein the slices of the tapered current DAC corresponding to lower DAC codes have a smaller weighting than the slices of the tapered current DAC corresponding to higher DAC codes.

10. The DCC circuit according to claim 1, wherein the first portion of the n-bit DAC code directly enables or disables one or more of the current sources to generate the correction current.

11. The DCC circuit according to claim 1, further comprising:
    a comparator for comparing a duty cycle of a clock signal of a first polarity at a first measurement node and a duty cycle of a clock signal of an opposite polarity at a second measurement node, and for outputting a difference signal;
    digital logic for generating the correction code and a sign bit indicating a direction of duty cycle correction; and
    a decoder for receiving the correction code and for outputting the DAC code.

12. A method for differential clock duty cycle correction (DCC), comprising:
    generating an n-bit digital to analog converter (DAC) code corresponding to a duty cycle correction, the DAC code having a first portion and a second portion;
    receiving the second portion of the DAC code at a current DAC, the current DAC generating a reference current in response to the second portion of the DAC code;
    for DAC codes in the first portion of the n-bit DAC code, controlling current sources in a hybrid current injector to generate a correction current; and
    for DAC codes in the second portion of the n-bit DAC code, generating the correction current in the hybrid current injector based on the reference current.

13. The method according to claim 12, wherein the current DAC generates a constant reference current over the first portion of the n-bit DAC code.

14. The method according to claim 12, wherein the first portion of the n-bit DAC code includes m least significant bits of the n-bit DAC code.

15. The method according to claim 14, wherein the second portion of the n-bit DAC code includes bits m+1 to n of the n-bit DAC code.

16. The method according to claim 12, wherein the first portion of the n-bit DAC code directly controls an effective size of the current sources in the hybrid current injector to generate the correction current.

17. The method according to claim 12, wherein the current sources comprise a plurality of semiconductors devices, the method further comprising biasing the current sources with the reference current when generating the correction current in response to DAC codes in the first portion of the n-bit DAC code, the biasing preventing the semiconductor devices in the current sources from operating in a sub-threshold region.

18. The method according to claim 12, wherein the current DAC comprises a tapered current DAC comprising a plurality of slices, the method further comprising weighting each of the plurality of slices to linearize a DCC step transfer function.

19. A differential clock duty cycle correction (DCC) circuit, comprising:
 an n-bit digital-to-analog converter (DAC) code corresponding to a DCC correction, the n-bit DAC code including a first portion including a first m bits of the n-bit DAC code and a second portion including bits m+1 to n of the n-bit DAC code;
 a hybrid current injector for generating a correction current, wherein the correction current is added to a clock signal of a first polarity at a first correction node and subtracted from a clock signal of an opposite polarity at a second correction node, and wherein the hybrid current injector is controlled by DAC codes in the first portion of the n-bit DAC code; and
 a tapered current DAC for receiving the second portion of the n-bit DAC code, and for outputting a corresponding reference current to the hybrid current injector, wherein the hybrid current injector generates the correction current in response to the reference current;
 wherein the tapered current DAC generates a constant reference current for DAC codes in the first portion of the n-bit DAC code; and
 wherein the DCC circuit has a substantially linear DCC step transfer function.

20. The DCC circuit according to claim 19, wherein the tapered current DAC comprises a plurality of slices, and wherein each of the plurality of slices is weighted to partially linearize the DCC step transfer function.

* * * * *